(12) United States Patent
Matsunawa et al.

(10) Patent No.: US 8,381,138 B2
(45) Date of Patent: Feb. 19, 2013

(54) SIMULATION MODEL CREATING METHOD, COMPUTER PROGRAM PRODUCT, AND METHOD OF MANUFACTURING A SEMICONDUCTOR DEVICE

(75) Inventors: Tetsuaki Matsunawa, Kanagawa (JP); Shoji Mimotogi, Kanagawa (JP); Masafumi Asano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/420,690

(22) Filed: Mar. 15, 2012

(65) Prior Publication Data
US 2012/0324407 A1     Dec. 20, 2012

(30) Foreign Application Priority Data
Jun. 15, 2011   (JP) ................................. 2011-133340

(51) Int. Cl.
     *G06F 17/50*      (2006.01)
(52) U.S. Cl. ................. 716/51; 716/52; 716/53; 716/54; 716/55
(58) Field of Classification Search .................. 716/53, 716/54, 55
See application file for complete search history.

(56) References Cited

U.S. PATENT DOCUMENTS

| 7,712,056 B2* | 5/2010 | White et al. ................. 716/136 |
| 7,747,978 B2* | 6/2010 | Ye et al. ......................... 716/50 |
| 7,962,867 B2* | 6/2011 | White et al. .................... 716/54 |
| 8,055,366 B2 | 11/2011 | Mimotogi et al. |

FOREIGN PATENT DOCUMENTS

| JP | 2004-61720 | 2/2004 |
| JP | 2009-42275 | 2/2009 |
| JP | 2009-229479 | 10/2009 |

* cited by examiner

*Primary Examiner* — Thuan Do
*Assistant Examiner* — Brian Ngo
(74) *Attorney, Agent, or Firm* — Finnegan, Henderson, Farabow, Garrett & Dunner, L.L.P.

(57) ABSTRACT

According to a simulation model creating method of an embodiment, a resist pattern is formed by transferring a mask pattern on a first substrate with an exposing amount and a focus value being changed, and a line width of the resist pattern is measured. Next, measurement results which are not within an allowable change range due to an irregularity of the exposing amount, an irregularity of the focus value or pattern feature amount are removed. In addition, measurement results which are not with in an allowable change range due to an irregularity of the line width of the mask pattern are removed. Next, a simulation model is created by using measurement results which are not removed.

20 Claims, 9 Drawing Sheets

FIG.6

| CALIBRATION PATTERN | SHAPE | | ACTUALLY MEASURED DATA | | | | |
|---|---|---|---|---|---|---|---|
| | LINE DIMENSION | SPACE DIMENSION | CON-DITION (1) | CON-DITION (2) | CON-DITION (3) | CON-DITION (4) | CON-DITION (5) |
| LINE PATTERN A | x1 | a | La1 | La2 | La3 | La4 | La5 |
| LINE PATTERN B | x1 | b | Lb1 | Lb2 | Lb3 | Lb4 | Lb5 |
| LINE PATTERN C | x1 | c | Lc1 | Lc2 | Lc3 | Lc4 | Lc5 |
| LINE PATTERN E | x1 | d | Ld1 | Ld2 | Ld3 | Ld4 | Ld5 |
| LINE PATTERN E | x1 | e | Le1 | Le2 | Le3 | Le4 | Le5 |
| SPACE PATTERN F | f | x2 | Sf1 | Sf2 | Sf3 | Sf4 | Sf5 |
| SPACE PATTERN G | g | x2 | Sg1 | Sg2 | Sg3 | Sg4 | Sg5 |
| SPACE PATTERN H | h | x2 | Sh1 | Sh2 | Sh3 | Sh4 | Sh5 |
| SPACE PATTERN I | i | x2 | Si1 | Si2 | Si3 | Si4 | Si5 |
| ⋮ | ⋮ | ⋮ | ⋮ | ⋮ | ⋮ | ⋮ | ⋮ |

US 8,381,138 B2

SIMULATION MODEL CREATING METHOD, COMPUTER PROGRAM PRODUCT, AND METHOD OF MANUFACTURING A SEMICONDUCTOR DEVICE

CROSS-REFERENCE TO RELATED APPLICATIONS

This application is based upon and claims the benefit of priority from Japanese Patent Application No. 2011-133340, filed on Jun. 15, 2011; the entire contents of which are incorporated herein by reference.

FIELD

Embodiments described herein relate generally to a simulation model creating method, a computer program product, and a method of manufacturing a semiconductor device.

BACKGROUND

In recent years, as size of LSI is getting smaller, a problem arises which is known as an optical proximity effect (OPE) that dimension change or shape change occurs between a pattern of an exposure mask and a pattern formed on a substrate (wafer). Therefore, optical proximity correction (OPC) where correction is applied to the mask pattern by taking into consideration influence of the optical proximity effect in advance is used.

As an OPC technique capable of obtaining a high correction accuracy, there is known a model-based OPC where an adjusting amount of an appropriate mask dimension is calculated based on lithography simulation. A model for the optical proximity correction is generated by adjusting model parameters such as acid diffusion of resist or mask shape so as to express the shape of mask pattern formed on the substrate. However, in the case where a measurement error of a critical dimension (CD) measurement value of the mask pattern is large, since the adjustment with respect to an abnormal value is also performed, reliability and accuracy of the model is lowered. Therefore, it is preferable that the accuracy of the simulation model is allowed to be improved by appropriately removing the abnormal value from the CD measurement values.

BRIEF DESCRIPTION OF THE DRAWINGS

FIG. 6 is a diagram illustrating examples of dimension measurement results of calibration patterns;

DETAILED DESCRIPTION

Figure 1:
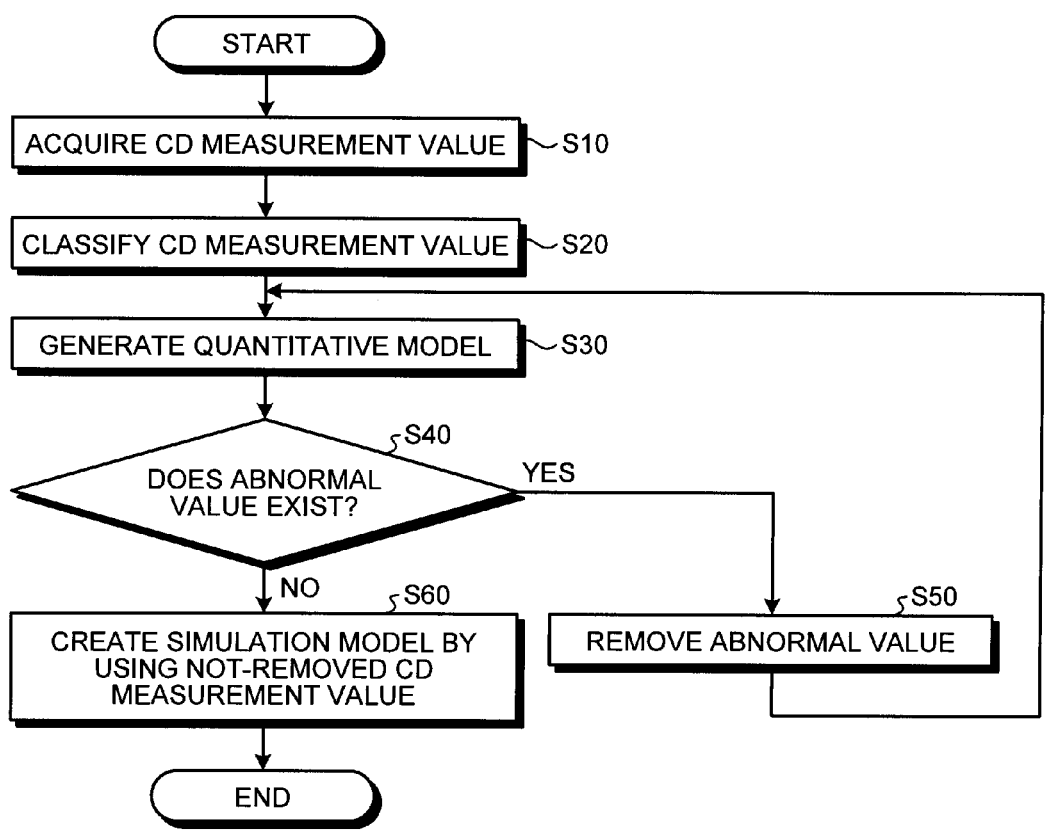
FIG. 1 is a diagram describing a concept of a simulation model creating method according to an embodiment.

According to an embodiment, there is provided a simulation model creating method. In the simulation model creating method, a resist pattern is formed by transferring a mask pattern on a first substrate with an exposing amount and a focus value being changed. Next, a line width of the resist pattern is measured. Next, a first function which is a polynomial equation including the exposing amount and the focus value as parameters and is fit for measurement results of the line width is calculated, and a difference value between the measurement results and the approximated value on the first function is calculated as a first difference. Next, the first difference is compared with a first allowable change range calculated from an irregularity of the exposing amount and an irregularity of the focus value as an allowable change range of the line width, and in a case where a first measurement result of which the first difference becomes larger than the first allowable change range exists in the measurement results, a first removing process is performed on the measurement results, and a first function which is fit for the measurement results after the removing is regenerated. In addition, until the first difference becomes smaller than the first allowable change range, the first removing process is repetitively performed. Next, a second function which is a polynomial equation including information on a pattern feature amount which is a feature amount of the pattern as a parameter and is fit for the measurement results of the line width is calculated with respect to each pattern feature amount, and a difference value between the measurement results and the approximated value on the second function is calculated as a second difference with respect to each pattern feature amount. Next, the second difference is compared with a second allowable change range calculated with respect to each pattern feature amount as an allowable change range of the line width with respect to each pattern feature amount, and in a case where a second measurement result of which the second difference becomes larger than the second allowable change range exists in the measurement results, a second removing process is performed on the measurement results, and a second function which is fit for the measurement results after the second removing is regenerated. In addition, until the second difference becomes smaller than the second allowable change range, the second removing process is repetitively performed. Next, lithography simulation is performed on the mask by using a simulation model created based on the measurement results after removing the first measurement result of which the first difference becomes larger than the first allowable change range, so that an estimated line width of a pattern performed on a first substrate is calculated. Next, a difference value between the estimated line width and the measurement results after removing the first measurement result of which the first difference becomes larger than the first allowable change range is calculated as a third difference. Next, the third difference is compared with a third allowable change range calculated from an average value and variation of the mask pattern line width as an allowable change range of the estimated line width, and in the case where the first measurement result of which the third difference becomes larger than the third allowable change range exists, the first measurement result is removed, and a simulation model is created based on the measurement results after the removing.

Hereinafter, a simulation model creating method, a computer program product, and a method of manufacturing a semiconductor device according to embodiments will be described in detail with reference to the attached drawings. In addition, the present invention is not limited to the embodiments.

Embodiment

FIG. 1 is a diagram describing a concept of a simulation model creating method according to an embodiment. The simulation model is, for example, a model of pattern forming simulation such as lithography simulation for optical proximity correction or the like and is used for model-based OPC or the like which calculates an appropriate adjustment amount of mask dimension.

In the simulation model creating method according to the embodiment, as an experiment acquiring OPE features, a test pattern (calibration pattern) is formed on a wafer (substrate), and dimension (shape) of the calibration pattern is measured by using a Critical Dimension-Scanning Electron Microscope (CD-SEM) or the like. Accordingly, in Step S10, CD measurement values (actually measured data) of the calibration pattern are acquired. As an example of the calibration pattern formed on the substrate is a resist pattern.

In order to create a simulation model, plural types of calibration patterns having various dimensions or various shapes are prepared. The calibration pattern is a pattern configured to fit model parameters of a simulation model. For example, the calibration pattern is a pattern having representative dimension and shape in an LSI circuit. With respect to the calibration pattern, various patterns are set within a range of design rule. In the embodiment, abnormal values are removed from the CD measurement values with respect to each type (pattern feature amount) of the calibration patterns, so that the simulation model is generated by using appropriate CD measurement values.

After the CD measurement values of the calibration pattern are acquired, in Step S20, the CD measurement values are classified with respect to each pattern feature amount of the calibration pattern. FIGS. 2A to 2E are diagrams illustrating pattern examples of calibration patterns.

Figure 2A:
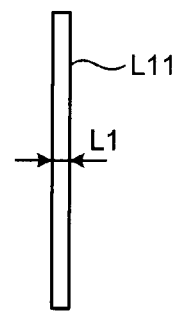
FIGS. 2A to 2E are diagrams illustrating pattern examples of calibration patterns.

The calibration pattern illustrated in FIG. 2A is an isolated line pattern L11. The isolated line pattern L11 is a line pattern which has no different patterns disposed in the neighborhood, and a dimension at a measurement site L1 is measured. The measurement site L1 is a substantially central portion of the isolated line pattern L11, and the dimension is a transverse dimension (width) of the isolated line pattern L11.

Figure 2B:
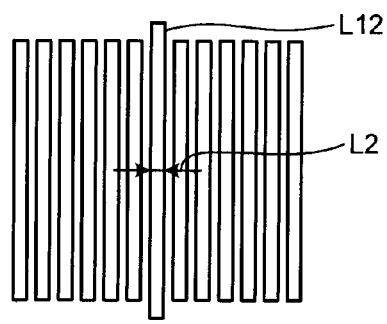

The calibration pattern illustrated in FIG. 2B is a high-density line pattern L12. The high-density line pattern L12 is a line pattern which is disposed within a line pattern group having a high pattern density. A plurality of line patterns are disposed to be aligned in parallel within the line pattern group, and the high-density line pattern L12 is disposed at a substantially central portion of the line pattern group. In the high-density line pattern L12, a dimension of a measurement site L2 is measured. The measurement site L2 is a substantially central portion of the high-density line pattern L12, and the dimension is a transverse dimension (width) of the high-density line pattern L12.

Figure 2C:
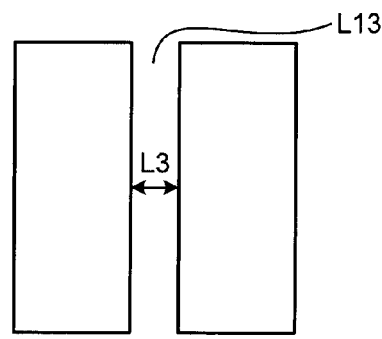

The calibration pattern illustrated in FIG. 2C is an isolated space pattern L13. The isolated space pattern L13 is an inter-pattern space pattern interposed between large patterns, and a dimension of a measurement site L3 is measured. The measurement site L3 is a substantially central portion of the isolated space pattern L13, and the dimension is a transverse dimension (width) of the isolated space pattern L13.

Figure 2D:
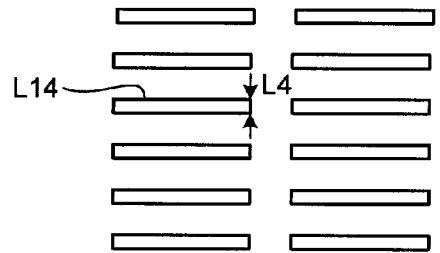

The calibration pattern illustrated in FIG. 2D is a high-density abutment line pattern (line end pattern) L14. The high-density abutment line pattern L14 is a line pattern which is disposed within a line pattern group having a high pattern density. The line pattern group is configured to include two line pattern sets, and a plurality of line patterns are aligned in parallel within each line pattern set. The one line pattern set and the other line pattern set are disposed so that longitudinal distal end portions of the line patterns face each other. In addition, the high-density abutment line pattern L14 is disposed at a substantially central portion of the one line pattern set. In the high-density abutment line pattern L14, a dimension of a measurement site L4 is measured. The measurement site L4 is the distal end portion (the other line pattern set side) (the sides where the distal end portions face each other) of the high-density abutment line pattern L14, and the dimension is a transverse dimension (width) of the high-density abutment line pattern L14.

Figure 2E:
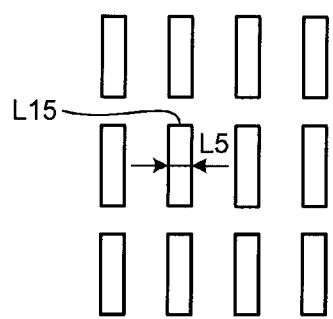

The calibration pattern illustrated in FIG. 2E is an island pattern L15. The island pattern L15 is one of island-shaped patterns which are disposed in certain intervals in the horizontal and vertical directions, and a dimension of a measurement site L5 is measured. The measurement site L5 is a substantially central portion of the island pattern L15, and the dimension is a transverse dimension (width) of the island pattern L15.

After the CD measurement values are classified, in Step S30, multivariable analysis or the like is applied to the CD measurement values to generate a quantitative model according to change of the exposing amount and change of the focus and a quantitative model according to a pattern feature amount. Next, differences between pattern dimensions calculated from the quantitative models and the CD measurement values are calculated. In Step S40, by comparing the differences with the allowable range of the differences, it is determined whether or not there is an abnormal value among the CD measurement values.

Among the CD measurement values, a CD measurement value corresponding to a difference expressing that the difference deviates from the allowable range becomes an abnormal value. In the case where there is an abnormal value (Yes in Step S40), in Step S50, the abnormal value is removed.

Next, in Step S30, a multivariable analysis or the like is applied to the abnormal value-removed CD measurement values to generate a quantitative model with respect to each exposing amount, each focus, and each pattern feature amount. Until there is no abnormal value, the processes of Steps S30 to S50 are repetitively performed. In the embodiment, the quantitative model is calculated with respect to each pattern feature amount, and the allowable range of the abnormal value is set with respect to each pattern feature amount. Next, the abnormality of the CD measurement value is performed with respect to each pattern feature amount, and the abnormal value with respect to each pattern feature amount is removed.

If all the abnormal values are removed (No in Step S40), in Step S60, the simulation model for lithography or the like is generated by using the CD measurement values (correction-completed dimension data) which are not removed.

Figure 3:
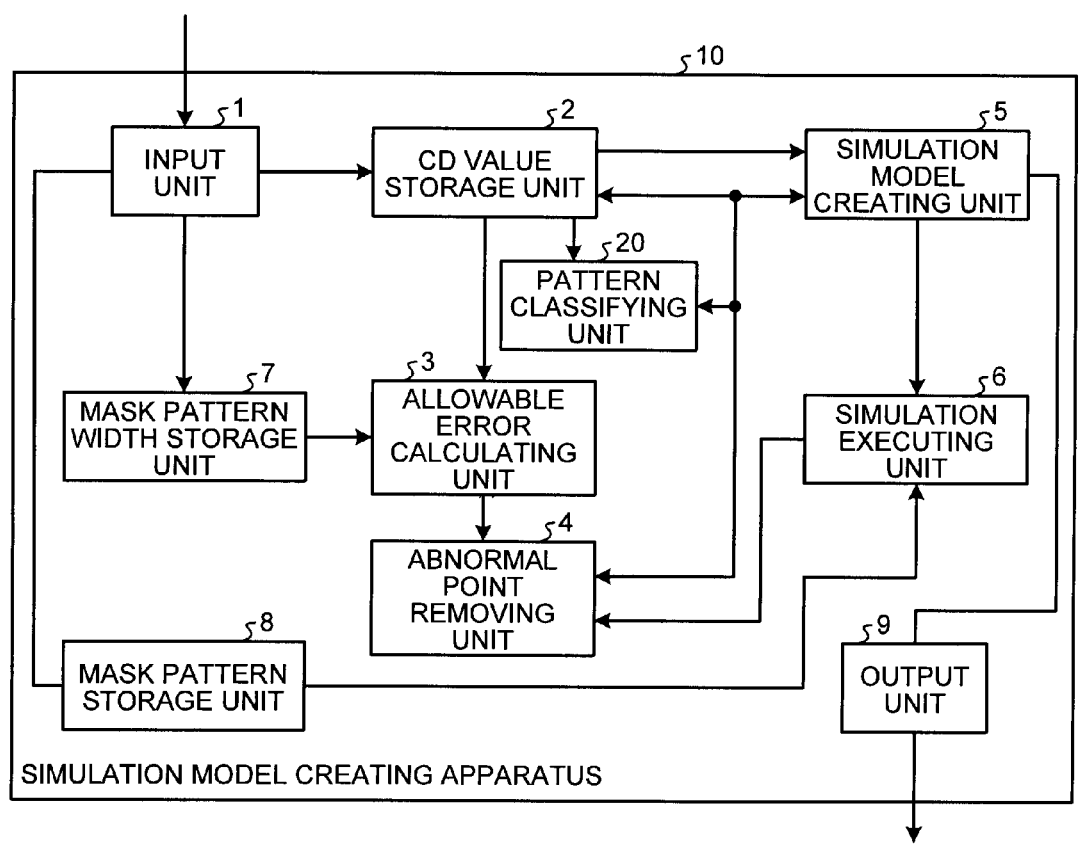
FIG. 3 is a diagram illustrating a configuration of a simulation model creating apparatus according to an embodiment.

FIG. 3 is a diagram illustrating a configuration of a simulation model creating apparatus according to an embodiment. The simulation model creating apparatus 10 is a computer which extracts and removes abnormal values from CD measurement values with respect to each pattern feature amount (pattern shape, pattern dimension, or the like) of the calibration pattern and creates the simulation model for lithography or the like by using the CD measurement values that are normal values.

The simulation model creating apparatus 10 is configured to include an input unit 1, a CD value storage unit 2, an allowable error calculating unit 3, an abnormal point removing unit 4, a simulation model creating unit 5, a simulation executing unit 6, a mask pattern width storage unit 7, a mask pattern storage unit 8, an output unit 9, and a pattern classifying unit 20.

The input unit 1 inputs a CD measurement value of a calibration pattern, information on a mask pattern width (average value and variation amount of a mask pattern width) (hereinafter, referred to as mask pattern width information), a mask pattern (pattern data), and the like. The input unit 1 transmits the input CD measurement value to the CD value storage unit 2 and transmits the input mask pattern width information to the mask pattern width storage unit 7. In addition, the input unit 1 transmits the input mask pattern to the mask pattern storage unit 8.

The CD value storage unit 2 is memory or the like which stores the CD measurement value; the mask pattern width storage unit 7 is memory or the like which stores the mask pattern width information; and the mask pattern storage unit 8 is memory or the like which stores the mask pattern. In the CD value storage unit 2, the CD measurement values, the pattern feature amounts of the calibration pattern, and the exposure conditions (exposing amount, focus value, and the like) are stored in a correspondence manner. The CD value storage unit 2 stores the remaining CD measurement values which are not removed by the abnormal point removing unit 4. In addition, the CD value storage unit 2 stores model CD values corresponding to desired conditions (for example, center doses) instead of the CD measurement values removed by the abnormal point removing unit 4 (replaces the CD measurement values with the model CD values).

The pattern classifying unit 20 classifies the CD measurement values of the CD value storage unit 2 according to the pattern feature amounts. For example, the pattern classifying unit 20 classifies the CD measurement values according to the calibration patterns illustrated in FIGS. 2A to 2E. The pattern classifying unit 20 stores the classified CD measurement values in the CD value storage unit 2 in a manner of correspondence to the pattern feature amounts.

The allowable error calculating unit 3 calculates an allowable error range (later-described allowable error range R1) of the CD measurement value with respect to the irregularity in the exposure condition and an allowable error range (later-described allowable error range R2) of the CD measurement value with respect to the pattern feature amount of the calibration pattern by using the CD measurement values in the CD value storage unit 2. In the embodiment, the allowable error calculating unit 3 calculates the allowable error range R2 with respect to each pattern feature amount of the calibration pattern. In addition, the allowable error calculating unit 3 calculates an allowable error range (later-described allowable error range R3) of the mask CD by using the mask pattern width information in the mask pattern width storage unit 7.

The abnormal point removing unit 4 removes the abnormal value which is not allowed as an irregularity of the exposure condition among irregularities of the CD measurement values based on the allowable error range R1. In addition, the abnormal point removing unit 4 removes the abnormal value which is not allowed as an irregularity of each pattern feature amount of the calibration pattern among the irregularities of the CD measurement values based on the allowable error range R2. More specifically, the abnormal point removing unit 4 expresses the pattern feature amount as a polynomial function with respect to each pattern feature amount and compares a shifted amount (later-described difference R″) of the CD measurement value from the polynomial function with the allowable error range R2. Next, the abnormal point removing unit 4 removes the CD measurement value having the difference R″ which is larger than the allowable error range R2 from the CD value storage unit 2.

In addition, the abnormal point removing unit 4 removes the abnormal value which is not allowed as an irregularity of the mask CD among irregularities of the CD measurement values based on the allowable error range R3. More specifically, the abnormal point removing unit 4 calculates a shifted amount (later-described difference R‴) between the CD measurement value and the dimension of the pattern on the wafer derived by the simulation executing unit 6. Next, the abnormal point removing unit 4 removes the CD measurement value having the difference R‴ which is larger than the allowable error range R3 from the CD value storage unit 2. Instead of the abnormal-point-removed CD measurement values, the abnormal point removing unit 4 allows the model CD value obtained from the mask pattern or the like to be stored in the CD value storage unit 2.

The simulation model creating unit 5 generates a simulation model by using the CD measurement values which are not removed by the removing process using the allowable error ranges R1 to R3. The simulation model generated by the simulation model creating unit 5 is, for example, a model configured to derive a shape or a dimension of a resist pattern in the case where the resist pattern is formed on a wafer by using a mask pattern (a model configured to derive a mask pattern configured to form a pattern having a desired shape). The simulation model creating unit 5 transmits the created simulation model to the simulation executing unit 6.

The simulation executing unit 6 applies the simulation model created by the simulation model creating unit 5 to the mask pattern stored in the mask pattern storage unit 8 to derive a resist pattern which is to be formed on the wafer. The output unit 9 outputs the simulation model created by the simulation model creating unit 5 to an external apparatus or the like.

In the simulation model creating apparatus 10, if the abnormal value which is removed based on the allowable error range R3 does not exist, the abnormal point removing unit 4 notifies the simulation model creating unit 5 that the abnormal value does not exist. Accordingly, the simulation model creating unit 5 transmits a newest simulation model to the output unit 9.

Figure 4:
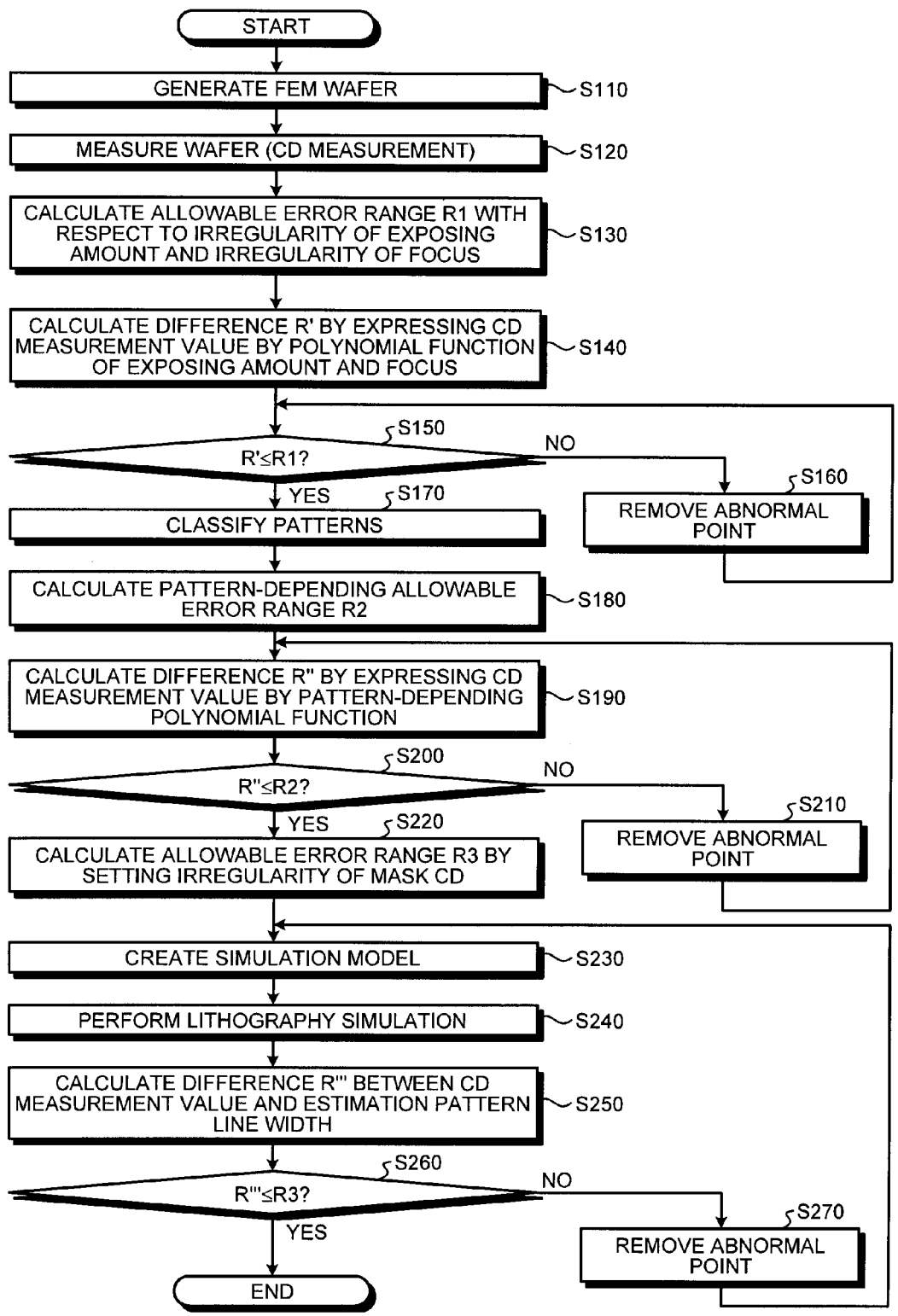
FIG. 4 is a flowchart illustrating a procedure of processes of a simulation model creating method according to an embodiment.

FIG. 4 is a flowchart illustrating a procedure of processes of a simulation model creating method according to an embodiment. In order to form a calibration pattern on a wafer, in Step S110, a focus exposure matrix (FEM) wafer is produced.

Figure 5:
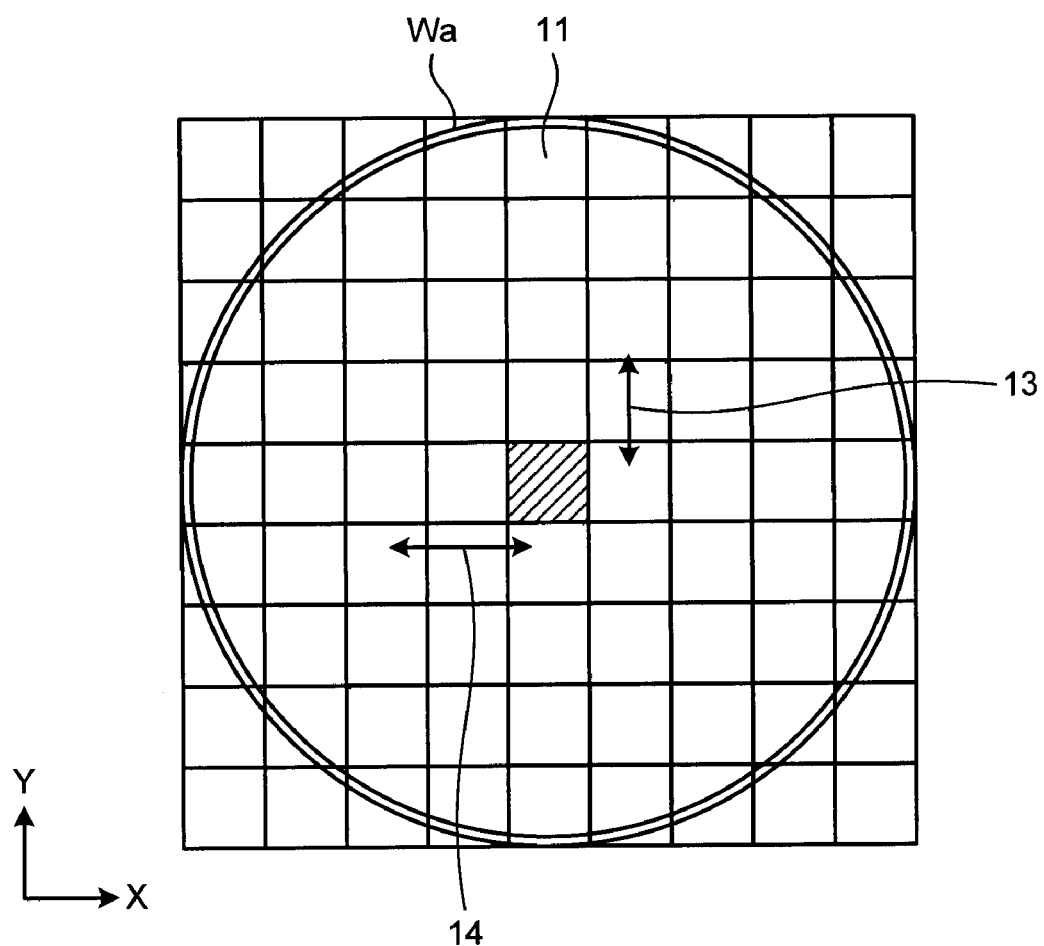
FIG. 5 is a diagram describing an FEM wafer.

FIG. 5 is a diagram describing the FEM wafer. Exposure shots 11 are disposed in a matrix shape on the FEM wafer Wa. For example, the best focus value and the best exposing amount as an exposure condition are set to the exposing shot 11 located at the center of the FEM wafer Wa.

Next, with respect to the exposing shots 11 aligned in a matrix shape, for example, various exposing amount conditions are set between the exposing shots 11 in the vertical direction 13 (Y direction), and various focus conditions are set between the exposing shots 11 in the horizontal direction 14 (X direction). For example, in the case where N exposing shots 11 (N is a natural number) are aligned in the vertical direction, the exposure conditions are set to the exposing shots so that different exposing amount conditions are set to the N exposing shots. Similarly, for example, in the case where M exposing shots 11 (M is a natural number) are aligned in the horizontal direction, the exposure conditions are set to the exposing shots so that different focus conditions are set to the M exposing shots. Accordingly, the exposing shots 11 where the exposing amount conditions and the focus conditions are variously combined are defined on the FEM wafer Wa.

An exposing apparatus transfers a mask pattern on a resist film on the FEM wafer Wa with the set exposing amount and the set focus being waved (changed), so that the resist pattern (calibration pattern) is generated.

After the FEM wafer Wa is produced, in Step S120, the dimension of the calibration pattern formed on the FEM wafer Wa is measured by using a CD-SEM or the like (CD measurement). Accordingly, the CD measurement value of the calibration pattern is acquired. Herein, the measuring process for the FEM wafer Wa corresponds to the above-described process (Step S10) of acquiring the CD measurement value of the calibration pattern.

In the embodiment, the above-described various calibration patterns (pattern having different feature amounts) are disposed on the mask (on the exposing shots 11). Therefore, it is possible to acquire the CD measurement values from various calibration patterns which are exposed under various exposure conditions.

FIG. 6 is a drawing illustrating examples of dimension measurement results of calibration patterns. FIG. 6 illustrates the dimensions of the calibration patterns (resist patterns) in the case where the exposure condition (exposing amount or the like) of the lithography process is changed with respect to each calibration pattern of which the line width of one of the line and the space is fixed and of which the line width of the other is changed. Herein, FIG. 6 illustrates the CD measurement values in the case of changing the exposure condition of Conditions (1) to (5).

As illustrated in FIG. 6, with respect to line patterns A to E, the design line dimensions are the same as x1. In addition, with respect to the line patterns A to E, the design space dimensions are a to e, respectively. In addition, with respect to space patterns F to I, the design space dimensions are the same as x2. In addition, with respect to the space patterns F to I, the design line dimensions are f to i, respectively.

For example, the CD measurement value of the line pattern A in the condition (1) is La1. Similarly, the CD measurement values of the line pattern A in the conditions (2) to (5) are La2 to La5, respectively. In addition, the CD measurement values of the line patterns B to E in the conditions (1) to (5) are Lb1 to Lb5, Lc1 to Lc5, Ld1 to Ld5, and Le1 to Le5, respectively. In addition, the CD measurement values of the space patterns F to I in the conditions (1) to (5) are Sf1 to Sf5, Sg1 to Sg5, Sh1 to Sh5, and Si1 to Si5, respectively.

In general, a line width W of a calibration pattern may be expressed by the following Equation 1 as a function of an exposing amount E, a focus value D, and a mask line width M.

[Equation 1]

$$W = f(E, D, M) \quad (1)$$

The case of obtaining the variation $\sigma W2$ as the irregularity of the line width W (CD measurement value) measured with respect to the calibration pattern will be described. When the variation of the irregularity of the exposing amount is denoted by $\sigma E2$ and the variation of the irregularity of the focus value is denoted by $\sigma D2$, if the mask line width M is fixed, the variation $\sigma W2$ can be expressed by the following (2).

[Equation 2]

$$\sigma_w^2 = \left(\frac{\partial f}{\partial E}\right)^2 \sigma_E^2 + \left(\frac{\partial f}{\partial D}\right)^2 \sigma_D^2 \quad (2)$$

Next, in Step S130, the allowable error calculating unit 3 calculates the allowable error range R1 with respect to the irregularity of the exposing amount and the irregularity of the focus value by using the variation $\sigma W2$. In other words, the allowable error calculating unit 3 calculates the allowable error range R1 of the line width at the exposing amount and the focus value by using the variation $\sigma W2$. The allowable error range R1 is a range of the allowable error of the line width, and for example, the allowable error range R1 is $R1 = 3 \times \sigma W$. Herein, although the allowable error range R1 is set to three times $\sigma W$, the multiple times other than the three times may be used, and the multiple times may be increased or decreased according to a required accuracy.

In addition, the allowable error range R1 may be, for example, an error (ratio) of the CD measurement value to a CD ideal value. For example, in the case where the allowable error range R1 is set to 1%, if the difference between the CD ideal value and the CD measurement value is 1% or more, it may be determined that the CD measurement value is an abnormal value. The CD ideal value may be calculated, for example, by numericalizing the result of space dependency of each exposing amount by using multivariable analysis.

For example, the line patterns A to E are exposed by various exposure conditions (exposing amounts and focus values). Next, the line patterns A to E have various dimension error (shifted amounts from an ideal value) caused by the irregularity of the exposing amount or the irregularity of the focus value. The range of the allowable error among the dimension errors becomes the allowable error range R1.

The CD measurement value of the calibration pattern (measurement result) is input to the input unit 1 and is stored in the CD value storage unit 2. In Step S140, the abnormal point removing unit 4 expresses the CD measurement value of the calibration pattern as a polynomial function of an exposing amount and a focus value and calculates the difference R'.

More specifically, in the abnormal point removing unit 4, the line widths W acquired as the CD measurement values are fitted by a polynomial function including the exposing amount E and the focus value D as parameters. The polynomial function (fitting function) configured for the fitting can be expressed by the following Equation (3) or (4), for example, using the exposing amount E. In Equations (3) and (4), W1 and W2 are examples of line width W.

[Equation 3]

$$W1 = (a \cdot D^2 + b \cdot D + c) \cdot E + (a' \cdot D^2 + b' \cdot D + c') \quad (3)$$

[Equation 4]

$$W2 = (a \cdot D^2 + b \cdot D + c) \cdot \log E + (a' \cdot D^2 + b' \cdot D + c') \quad (4)$$

Herein, a', a, b, b', c, and c' denote coefficients which are determined through the fitting.

The abnormal point removing unit 4 calculates a difference between the CD measurement value and the approximated value of the line width W1 or W2 obtained by using Equation (3) or (4) as the difference R'. In other words, the regression line for the CD measurement value at each does is calculated, and the dimension at the center does is calculated as an ideal CD measurement value. Next, a difference between the ideal CD measurement value and the CD measurement value is calculated as the difference R'.

The abnormal point removing unit 4 determines whether or not a measurement point (CD measurement value) of which the difference R' is larger than the allowable error range R1 exists. More specifically, in Step S150, the abnormal point removing unit 4 determines whether or not each measurement point satisfies $R1 \leq R'$, and the CD measurement value satisfying $R1 \leq R'$ is extracted. Next, if the CD measurement value satisfying $R1 \leq R'$ can be extracted (No in Step S150), in Step S160, the abnormal point removing unit 4 removes the CD measurement value as an abnormal point from the CD value storage unit 2.

The abnormal point removing unit 4 applies the CD ideal value, which is obtained from the mask pattern or the like, to the CD measurement value of the point which is removed as an abnormal point. Next, in Step S140, the abnormal point removing unit 4 expresses the CD measurement value of the calibration pattern by a polynomial function of an exposing amount and a focus value and calculates the difference R' again. In addition, in Step S150, the abnormal point removing unit 4 determines whether or not R1≦R' is satisfied, and the CD measurement value satisfying R1≦R' is extracted. Next, if the CD measurement value is extracted, in Step S160, the abnormal point removing unit 4 removes the CD measurement value as an abnormal point from the CD value storage unit 2. The abnormal point removing unit 4 repetitively performs the processes of Steps S140 to S160 until the CD measurement value satisfying R1≦R' is not extracted.

If the CD measurement value satisfying R1≦R' cannot be extracted (Yes in Step S150), the abnormal point removing unit 4 notifies the pattern classifying unit 20 that the CD measurement value satisfying R1≦R' does not exist.

The pattern classifying unit 20 classifies the CD measurement values in the CD value storage unit 2 based on the pattern feature amount. More specifically, in Step S170, the pattern classifying unit 20 classifies the calibration patterns according to each mask pattern feature amount, and the CD measurement values are classified based on the classification result of the pattern classification.

The pattern feature amount may be, for example, a shape of a calibration pattern or a dimension of a calibration pattern. In addition, the pattern feature amount may be an optical image or the like. In Step S180, the allowable error calculating unit 3 calculates the pattern-depending allowable error range R2 with respect to the CD measurement values which are classified according to the pattern feature amount. In other words, the allowable error calculating unit 3 calculates the allowable error range R2 with respect to the CD measurement value based on the irregularity depending on the shape of the pattern. The allowable error range R2 is a range of the allowable error of the line width and is calculated with respect to each pattern feature amount.

For example, as calibration patterns, the line patterns A to E or the like are formed on the FEM wafer Wa. In this case, if the shape of the calibration pattern is set as a pattern feature amount, the calibration patterns are classified into the line patterns A to E.

The line patterns A to E have various dimension errors (shifted amounts from an ideal values) caused by difference in the pattern feature amounts. The range of the allowable error among the dimension errors with respect to each pattern feature amount becomes the allowable error range R2 with respect to each pattern feature amount.

For example, when an average value of the change (error) of the pattern line width P (CD measurement value) is denoted by Pmean and the variation of the irregularity of the pattern line width P is denoted by σP2, the allowable error range R2 can be expressed by the following Equation (5). Since the effect of the irregularity of the exposing amount and the effect of the irregularity of the focus value are removed, during the calculation of the allowable error range R2, as expressed by Equation (5), only the change of the pattern line width P may be taken into consideration.

[Equation 5]

$$R2 = \left|\frac{\partial f}{\partial P}\right|(|P_{mean}| + 3\sigma_P) \quad (5)$$

Next, the abnormal point removing unit 4 expresses the CD measurement value as a polynomial function depending on a pattern and calculates the difference R" (Step S190). More specifically, the abnormal point removing unit 4 generates a quantitative model with respect to each pattern feature amount by using multivariable analysis. The quantitative model is a model according to irregularity of the CD measurement value depending on the pattern feature amount and is generated with respect to each pattern feature amount by using the CD measurement value. For example, the line widths W acquired as the CD measurement values are fitted by using a polynomial function including information on the pattern feature amount as parameters, and the polynomial function (fitting function) configured for the fitting is expressed, for example, by the following Equation (6) or the like. In Equation (6), W3 indicates a line width. In addition, herein, an denotes a coefficient determined by fitting; P denotes a type of a pattern; and n denotes an order determined by P.

[Equation 6]

$$W3 = \Sigma a_n P^n \quad (6)$$

The abnormal point removing unit 4 calculates a difference between the CD measurement value and an approximated value of the line width W3 obtained by Equation (6) as a difference R". The abnormal point removing unit 4 determines whether or not a measurement point (measurement result) of which the difference R" is larger than the allowable error range R2 exists. More specifically, in Step S200, the abnormal point removing unit 4 determines whether or not R"≦R2 is satisfied, and the CD measurement value satisfying R"≦R2 is extracted. Next, if the CD measurement value satisfying R"≦R2 can be extracted (No in Step S200), in Step S210, the abnormal point removing unit 4 removes the CD measurement value as an abnormal point from the CD value storage unit 2. In other words, the abnormal point removing unit 4 determines whether or not the CD measurement value of which the difference R" between an approximated value according to a quantitative model and a measured CD measurement value is larger than the allowable error range R2 as an abnormal value and removes the abnormal value.

The abnormal point removing unit 4 applies a model CD value obtained from a mask pattern or the like to the CD measurement value at a point which is removed as an abnormal point. Next, in Step S190, the abnormal point removing unit 4 expresses the CD measurement value of the calibration pattern after the removing of the abnormal value as a polynomial function depending on a pattern to generate a quantitative model again and calculates the difference R". In addition, in Step S200, the abnormal point removing unit 4 determines whether or not R"≦R2 is satisfied, and the CD measurement value satisfying R"≦R2 is extracted. Next, if the CD measurement value is extracted, in Step S210, the abnormal point removing unit 4 removes the CD measurement value as an abnormal point from the CD value storage unit 2. The abnormal point removing unit 4 repetitively performs Steps S190 to S210 until the CD measurement value satisfying R"≦R2 is not extracted. In other words, the processes of Steps S190 to S210 are repetitively performed until the difference R" between the approximated value according to the quantitative model and the CD measurement value is within the allowable error range R2.

If the CD measurement value satisfying R"≦R2 cannot be extracted (Yes in Step S200), the abnormal point removing unit 4 notifies the simulation model creating unit 5 that the CD measurement value satisfying R"≦R2 does not exist. The simulation model creating unit 5 obtains a reference exposing amount and a reference focus value from a desired pattern line width by using the abnormal-point-removed CD measurement value and the fitting function. For example, the exposing amount where a desired pattern line width becomes a local maximum value of the fitting function is set to the reference exposing amount, and the focus value at this time is set to the reference focus.

In addition, in Step S220, the allowable error calculating unit 3 sets an irregularity of CD of mask pattern (mask line width M) and calculates the allowable error range R3. More specifically, the allowable error calculating unit 3 calculates the allowable error range R3 by using mask pattern width information (an average value and an irregularity amount of the mask pattern) in the mask pattern width storage unit 7. Accordingly, in Step S220, the allowable error calculating unit 3 calculates the allowable error range R3 of the pattern line width depending on the mask line width M.

If an average value of change (error) of the mask line width M is denoted by Mmean and a variation of the irregularity is denoted by σM2, the allowable error range R3 can be expressed by the following Equation (7). Since the effect of the irregularity of the exposing amount, the effects of the irregularity of the focus value, and the effect of the pattern feature amount are removed, during the calculation of the allowable error range R3, as expressed by Equation (7), only the change of the mask line width may be taken into consideration.

[Equation 7]

$$R3 = \left|\frac{\partial f}{\partial M}\right|(|M_{mean}| + 3\sigma_M) \quad (7)$$

Subsequently, in Step S230, the simulation model creating unit 5 applies a quantitative model to the CD measurement values to calculate approximated values in a desired condition and generates a simulation model by using each approximated value as a final CD measurement value (modeling). At this time, the simulation model creating unit 5 creates the simulation model by taking into consideration illumination conditions of an exposing apparatus, a mask pattern, conditions of a projection optical system, and the like. For example, a reference exposing amount and a reference focus value calculated by the abnormal point removing unit 4 is applied to the simulation model. The simulation model creating unit 5 transmits the generated simulation model to the simulation executing unit 6.

In Step S240, the simulation executing unit 6 applies the simulation model to the mask pattern in the mask pattern storage unit 8 to perform the lithography simulation. Accordingly, in the case where a resist pattern is formed on a wafer by using the mask pattern, a shape or dimension of a resist pattern is derived. The simulation executing unit 6 transmits the derived shape or dimension of the resist pattern as an estimation pattern line width to the abnormal point removing unit 4.

Next, in Step S250, the abnormal point removing unit 4 calculates the difference R'" between the CD measurement value which is not removed as an abnormal value and the estimation pattern line width obtained by the lithography simulation.

The abnormal point removing unit 4 determines whether or not a measurement point (measurement result) of which the difference R'" is larger than the allowable error range R3 exists. More specifically, in Step S260, the abnormal point removing unit 4 determines whether or not R'"≦R3 is satisfied, and the CD measurement value satisfying R'"≦R3 is extracted. Next, if the CD measurement value satisfying R'"≦R3 can be extracted (No in Step S260), in Step S270, the abnormal point removing unit 4 removes the CD measurement value as an abnormal point from the CD value storage unit 2. In other words, the abnormal point removing unit 4 determines that the CD measurement value, of which the difference R'" between the CD measurement value and the estimation pattern line width obtained by the lithography simulation is larger than the allowable error range R3, as an abnormal value and removes the abnormal value.

The abnormal point removing unit 4 applies a model CD value obtained from a mask pattern data or the like to the CD measurement value at a point which is removed as an abnormal point. Next, in Step S230, the simulation model creating unit 5 generates the simulation model again by using the CD measurement value of the calibration pattern after the removing of the abnormal value. The previously-generated simulation is replaced with (overwritten by) the simulation model. Next, in Step S240, the simulation executing unit 6 performs the lithography simulation by using the newest simulation model.

Next, in Step S250, the abnormal point removing unit 4 calculates the difference R'" between the CD measurement value which is not removed as an abnormal value and an estimation pattern line width obtained by the lithography simulation. In addition, in Step S260, the abnormal point removing unit 4 determines whether or not R'"≦R3 is satisfied, and the CD measurement value satisfying R'"≦R3 is extracted. Next, in the case where the CD measurement value is extracted, in Step S270, the abnormal point removing unit 4 removes the CD measurement value as an abnormal point from the CD value storage unit 2. The abnormal point removing unit 4 repetitively performs the processes Steps S230 to S270 until the CD measurement value satisfying R'"≦R3 is not extracted. In other words, the processes of Steps S230 to S270 are repetitively performed until the difference R'" between the approximated value according to the model and the CD measurement value is within the allowable error range R3.

If the CD measurement value satisfying R'"≦R3 cannot be extracted (Yes in Step S260) the abnormal point removing unit 4 notifies the simulation model creating unit 5 that the CD measurement value satisfying R'"≦R3 cannot be extracted. Accordingly, the simulation model creating unit 5 applies a newest simulation model as a simulation model and allows the process of creating the simulation model to be ended. The newest simulation model is output from the output unit 9 to an external apparatus.

In addition, during the removing of the abnormal point, Mahalanobis distance d at each measurement point may be calculated by using an approximated equation of line width W having an exposing amount E and a focus value D as parameters, and the CD measurement value of which the Mahalanobis distance d is equal to or larger than a predetermined threshold value may be removed.

The Mahalanobis distance d can be expressed by the following Equation (8).

[Equation 8]

$$d = \frac{|w - wf|}{\sigma} \quad (8)$$

Herein, wf denotes an approximated value in each of set exposing amount/focus value, and σ denotes a standard deviation of w−wf over the entire measurement points.

OPC-completed mask data are generated from design data by using the created simulation model. In addition, a photomask is produced based on the generated mask data. A mask pattern formed on the photomask, which is produced in this manner, is transferred to the photoresist of the wafer (semiconductor substrate) by an exposing process, and the photoresist is developed, so that a resist pattern is formed. A pattern is formed on the wafer by performing etching by using the resist pattern as a mask. During the manufacturing of the semiconductor device (semiconductor integrated circuit), the exposing process, the developing process, and the etching process described above are repetitively performed with respect to each layer.

As the CD measurement values, dimension data of the resist pattern or observation images (contours of top-surface observation images) obtained by SEM can be used. In addition, as the CD measurement values, dimension or the like of the resist pattern may be used in the case where the focus condition as well as the exposing amount condition is changed or in the case where the optical condition is changed. In addition, instead of the dimension of the resist pattern, the dimension of the processed pattern after an etching process may be used as the CD measurement values.

Figure 7:
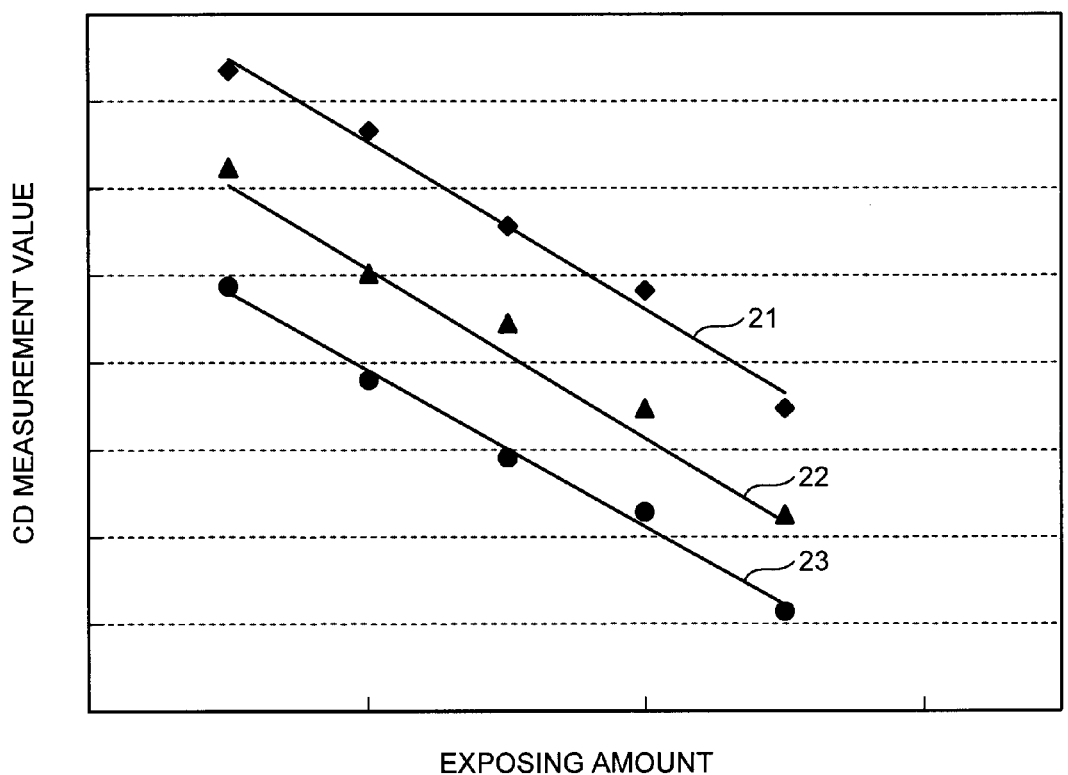
FIG. 7 is a diagram illustrating regression lines for CD measurement values.

Next, the classification (grouping) of CD measurement values according to the pattern feature amount will be described. FIG. 7 is a diagram illustrating regression lines for CD measurement values. FIG. 7 illustrates regression lines calculated with respect to the CD measurement values in the case of using first to third exposing amounts (doses). In FIG. 7, the horizontal axis represents the exposing amount, and the vertical axis represents the CD measurement value.

FIG. 7 illustrates an analysis result of the calibration pattern in the case where the line width is fixed and the space width is changed to various values with respect to an L/S pattern which is configured to include a line pattern and a space pattern.

The regression line 21 is a regression line calculated from the relation between the exposing amount and the CD measurement value with respect to the first L/S pattern dimension. Similarly, the regression line 22 is a regression line calculated from the relation between the exposing amount and the CD measurement value with respect to the second L/S pattern dimension, and the regression line 23 is a regression line calculated from the relation between the exposing amount and the CD measurement value with respect to the third L/S pattern dimension.

With respect to the classification of the CD measurement values, the same classification may be performed, for example, on the calibration patterns (the isolated line pattern L11, the high-density abutment line pattern L14, and the like) illustrated in FIGS. 2A to 2E or patterns in addition to an L/S pattern such as a static random access memory (SRAM) pattern.

Figure 8A:
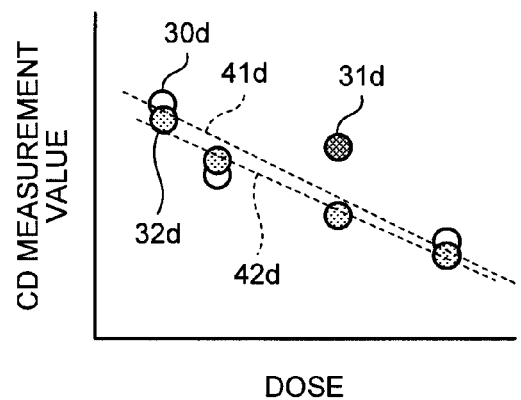
FIGS. 8A to 8C are diagrams diagrammatically illustrating approximation curves of CD measurement values.
Figure 8B:
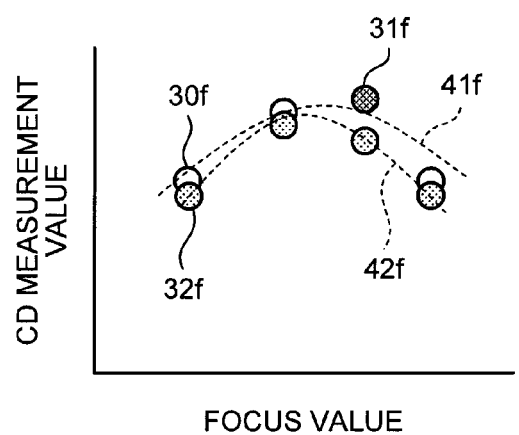
Figure 8C:
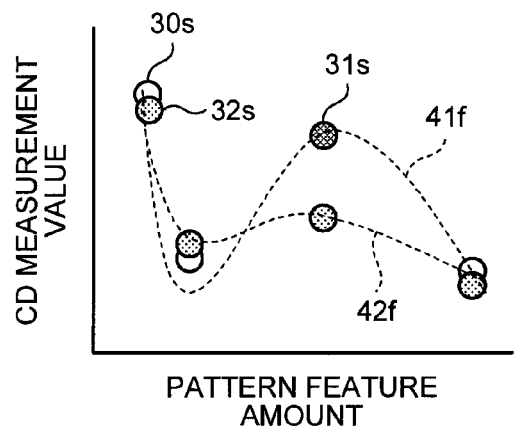

Next, approximation curves after the removing of the abnormal values will be described. FIGS. 8A to 8C are diagrams diagrammatically illustrating approximation curves of space dimensions of calibration patterns. FIGS. 8A to 8C illustrate analysis results of the calibration patterns in a case where the line width is fixed and the space width is changed into various values with respect to L/S patterns. In each of the graphs of FIGS. 8A to 8C, the vertical axis represents a space dimension.

FIG. 8A illustrates a relation between the exposing amount and the CD measurement value (space dimension), and FIG. 8B illustrates a relation between the focus value and the CD measurement value (space dimension). In addition, FIG. 8C illustrates a relation between the pattern feature amount (for example, the space dimension or the like of the L/S pattern) and the CD measurement value (space dimension).

In FIGS. 8A to 8C, CD measurement values 30d, 30f, 30s, 31d, 31f, and 31s are actually measured CD measurement values (raw data). Among them, the CD measurement values 31d, 31f, and 31s are abnormal values. In addition, approximation curves 41d, 41f, and 41s are approximation curves with respect to the actually measured CD measurement values.

The polynomial approximation to remove the abnormal value configured to calculate the relation between the exposing amount and the CD measurement value is, for example, a linear approximation. In addition, the polynomial approximation to remove the abnormal value configured to calculate the relation between the focus value and the CD measurement value is, for example, a quadratic approximation. In addition, the polynomial approximation to remove the abnormal value configured to calculate the relation between the pattern feature amount and the CD measurement value is, for example, a third-order approximation in the case of an isolated pattern and a fourth-order approximation in the case of a dense pattern.

As illustrated in FIG. 8A, the approximation curve 41d for the CD measurement values 30d and 31d has a large irregularity with respect to the CD measurement values 30d and 31d. In this case, if the approximation curve 42d is calculated by removing the CD measurement value 31d which is an abnormal value (by replacing with an ideal value), the CD measurement value 32d of the approximation curve 42d (corrected CD measurement value 32d) has a small shifted amount from the approximation curve 42d.

Similarly, as illustrated in FIG. 8B, the approximation curve 41f for the CD measurement values 30f and 31f has a large irregularity with respect to the CD measurement values 30f and 31f. In this case, if the approximation curve 42f is calculated by removing the CD measurement value 31f which is an abnormal value (by replacing with an ideal value), the CD measurement value 32f of the approximation curve 42f (corrected CD measurement value 32f) has a small shifted amount from the approximation curve 42f.

In addition, as illustrated in FIG. 8C, the approximation curve 41s for the CD measurement values 30s and 31s has a large irregularity with respect to the CD measurement values 30s and 31s. In this case, if the approximation curve 42s is calculated by removing the CD measurement value 31s which is an abnormal value (by replacing with an ideal value), the CD measurement value 32s of the approximation curve 42s (corrected CD measurement value 32s) has a small shifted amount from the approximation curve 42s.

In the embodiment, the abnormal value caused by the exposing amount and the abnormal value caused by the focus value are removed by abnormal value removing processes illustrated FIGS. 8A and 8B, respectively. In addition, the abnormal value caused by difference in the pattern feature amount is removed by an abnormal value removing process illustrated in FIG. 8C. Accordingly, the abnormal values can be removed at a high accuracy. This is because the variation occurring in the CD measurement value caused by the process change, the mask variation, the measurement error, or the like can be appropriately removed by limiting the difference between the ideal value and the CD measurement value with respect to the pattern feature amount in addition to the exposing amount and the focus value.

In the embodiment, the abnormal values are extracted based on the pattern feature amount by using a multivariable analysis. Next, a quantitative model is regenerated by using the CD measurement values where the extracted abnormal values are removed. Therefore, it is possible to effectively remove the abnormal values caused by the measurement error of the dimension data or the random error/systematic error.

In addition, in the modeling of the optical proximity correction during the manufacturing of the semiconductor device, a model function is expressed by a polynomial equation so that the simulation result approaches actually measured values. Therefore, since the frequency that the polynomial equation approaches the abnormal value is decreased by reducing the influence of the measurement error, it is possible to improve an estimated accuracy of the simulation model.

In addition, the resist pattern is formed on the substrate with the exposing amount or the focus value being changed in the lithography process, so that it is possible to obtain experimental data (CD measurement value) taking into consideration a process margin. In other words, it is possible to appropriately screen the experimental data taking into consideration the process margin. Therefore, the simulation model is created by using the experimental data, so that it is possible to obtain a simulation model capable of reproducing the change of the process at a high accuracy.

Figure 9:
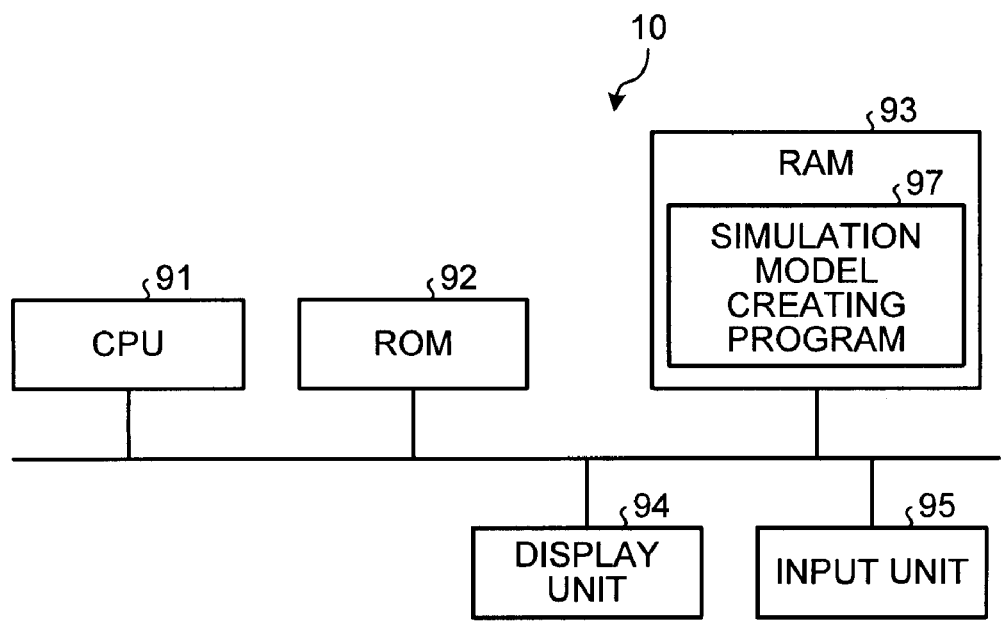
FIG. 9 is a diagram illustrating a hardware configuration of a simulation model creating apparatus.

Next, a hardware configuration of the simulation model creating apparatus 10 will be described. FIG. 9 is a diagram illustrating a hardware configuration of a simulation model creating apparatus. The simulation model creating apparatus 10 is configured to include a central processing unit (CPU) 91, read only memory (ROM) 92, random access memory (RAM) 93, a display unit 94, and an input unit 95. In the simulation model creating apparatus 10, the CPU 91, the ROM 92, the RAM 93, the display unit 94, and the input unit 95 are connected to each other via a bus line.

The CPU 91 executes pattern determination by using a simulation model creating program 97 which is a computer program. The display unit 94 is a display apparatus such as a liquid crystal monitor to display CD measurement values of calibration patterns, pattern feature amounts (pattern shapes or the like), mask pattern width information, mask pattern, exposure conditions, allowable error ranges R1 to R3, differences R', R", and R''', simulation models, abnormal points, and the like based on a command from the CPU 91. The input unit 95 is configured to include a mouse or a keyboard to input command information (parameters or the like necessary for creating a simulation model) which is externally input from a user. The command information input to the input unit 95 is transmitted to the CPU 91.

The simulation model creating program 97 is stored in the ROM 92 and loaded on the RAM 93 via the bus line. FIG. 9 illustrates a state where the simulation model creating program 97 is loaded on the RAM 93.

The CPU 91 executes the simulation model creating program 97 loaded on the RAM 93. More specifically, in the simulation model creating apparatus 10, according to command input from the input unit 95 by a user, the CPU 91 reads the simulation model creating program 97 from the ROM 92, develops the simulation model creating program 97 on a program storage area in the RAM 93, and executes various processes. The CPU 91 temporarily stores various data generated during the various processes in the data storage area formed in the RAM 93.

The simulation model creating program 97 executed by the simulation model creating apparatus 10 is configured with modules including the allowable error calculating unit 3, the abnormal point removing unit 4, the simulation model creating unit 5, and the simulation executing unit 6. The modules are loaded on a main storage device, and the modules are generated on the main storage device.

In addition, the simulation model creating apparatus 10 and the simulation executing unit 6 may be separately configured. In this case, the simulation model creating program 97 is configured with modules including the allowable error calculating unit 3, the abnormal point removing unit 4, and the simulation model creating unit 5. In addition, the simulation model creating program 97 creates a simulation model by using a result of the simulation executed by the simulation executing unit 6.

In addition, the pattern classifying process may be performed at any timing before the allowable error range R2 is calculated. In addition, in the embodiment, although the case where the exposure condition is an exposing amount or a focus value is described, the exposure condition is not limited to the exposing amount and the focus value.

In addition, the allowable error range R1 may be calculated at any timing before it is determined that $R''' \leq R3$. Similarly, the allowable error ranges R2 and R3 may be calculated at any timing before it is determined that $R'' \leq R2$ and $R''' \leq R3$, respectively.

In this manner, according to the embodiment, since the abnormal values are removed from the CD measurement values with respect to each feature amount of the mask pattern, it is possible to remove the abnormal values at a high accuracy. Therefore, the influence of the measurement error can be reduced, so that it is possible to create a simulation model for highly accurate optical proximity correction.

In addition, since the processes from the acquisition of the CD measurement value and to the removing of the abnormal point can be automatically performed through execution of a program without human intervention, it is possible to improve data processing efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A simulation model creating method comprising:
    forming a resist pattern by transferring a mask pattern on a first substrate with an exposing amount and a focus value being changed;
    measuring a line width of the resist pattern;
    calculating a first function which is a polynomial equation including the exposing amount and the focus value as parameters and is fit for measurement results of the line width and calculating a difference value between the measurement results and the approximated value on the first function as a first difference;
    comparing, by a computer the first difference with a first allowable change range calculated from an irregularity of the exposing amount and an irregularity of the focus value as an allowable change range of the line width and, in the case where a first measurement result of which the first difference becomes larger than the first allowable change range exists in the measurement results, removing the first measurement result and regenerating a first function which is fit for the measurement results after removing the first measurement result;

repeating a process of removing the first measurement result and regenerating the first function until the first difference becomes smaller than the first allowable change range;

calculating a second function which is a polynomial equation including information on a pattern feature amount which is a feature amount of the pattern as a parameter and is fit for the measurement results of the line width with respect to each pattern feature amount and calculating a difference value between the measurement results and the approximated value on the second function as a second difference with respect to each pattern feature amount;

comparing the second difference with a second allowable change range calculated with respect to each pattern feature amount as an allowable change range of the line width with respect to each pattern feature amount and, in the case where a second measurement result of which the second difference becomes larger than the second allowable change range exists in the measurement results, removing the second measurement result and regenerating a second function which is fit for the measurement results after removing the second measurement result;

repeating a process of removing the second measurement result and regenerating the second function until the second difference becomes smaller than the second allowable change range;

calculating an estimated line width of a pattern performed on a second substrate by performing lithography simulation on the mask by using a first simulation model created based on the measurement results after removing the first measurement result;

calculating a difference value between the estimated line width and the measurement results after removing the first measurement result as a third difference; and comparing the third difference with a third allowable change range calculated from an average value and variation of the mask pattern line width as an allowable change range of the estimated line width and, in the case where a third measurement result of which the third difference becomes larger than the third allowable change range exists, removing the third measurement result and creating a second simulation model based on the measurement results after removing the third measurement result.

2. The simulation model creating method according to claim 1, wherein, after the first difference becomes smaller than the first allowable change range, the second allowable change range is calculated from an average value and variation of the measurement results by using the measurement results after removing the first measurement result.

3. The simulation model creating method according to claim 1,
wherein the measurement results are classified with respect to each pattern feature amount, and
wherein the second function is calculated based on the classified the measurement results with respect to each classified pattern feature amount.

4. The simulation model creating method according to claim 1,
wherein information on the pattern feature amount is a shape or dimension of the pattern.

5. The simulation model creating method according to claim 3,
wherein, when the measurement results are to be classified with respect to each pattern feature amount, the measurement results are classified based on information on the shape of the resist pattern.

6. The simulation model creating method according to claim 1,
wherein the line width is measured by using dimension data of the resist pattern formed on the first substrate or a top surface observation image of the resist pattern.

7. The simulation model creating method according to claim 3,
wherein the second function is a quantitative model according to an irregularity of the measurement results depending on the pattern feature amount, and the quantitative model is calculated with respect to each pattern feature amount based on the classified measurement results.

8. A computer program product having a non-transitory computer-readable medium including a plurality of commands for creating a simulation model executable in a computer, the commands causing the computer to execute:
inputting a line width measured with respect to a resist pattern formed by transferring a mask pattern to a first substrate with an exposing amount and a focus value being changed;

calculating a first function which is a polynomial equation including the exposing amount and the focus value as parameters and is fit for measurement results of the line width and calculating a difference value between the measurement results and the approximated value on the first function as a first difference;

comparing the first difference with a first allowable change range calculated from an irregularity of the exposing amount and an irregularity of the focus value as an allowable change range of the line width and, in the case where a first measurement result of which the first difference becomes larger than the first allowable change range exists in the measurement results, removing the first measurement result and regenerating a first function which is fit for the measurement results after removing the first measurement result;

repeating a process of removing the first measurement result and regenerating the first function until the first difference becomes smaller than the first allowable change range;

calculating a second function which is a polynomial equation including information on a pattern feature amount which is a feature amount of the pattern as a parameter and is fit for the measurement results of the line width with respect to each pattern feature amount and calculating a difference value between the measurement results and the approximated value on the second function as a second difference with respect to each pattern feature amount;

comparing the second difference with a second allowable change range calculated with respect to each pattern feature amount as an allowable change range of the line width with respect to each pattern feature amount and, in the case where a second measurement result of which the second difference becomes larger than the second allowable change range exists in the measurement results, removing the second measurement result and regenerating a second function which is fit for the measurement results after removing the second measurement result;

repeating a process of removing the second measurement result and regenerating the second function until the second difference becomes smaller than the second allowable change range;

calculating an estimated line width of a pattern performed on a second substrate by performing lithography simulation on the mask by using a first simulation model created based on the measurement results after removing the first measurement result and, after that, calculating a difference value between the estimated line width and the measurement results after removing the first measurement result as a third difference; and comparing the third difference with a third allowable change range calculated from an average value and variation of the mask pattern line width as an allowable change range of the estimated line width and, in the case where a third measurement result of which the third difference becomes larger than the third allowable change range exists, removing the third measurement result and creating a second simulation model based on the measurement results after removing the third measurement result.

9. The computer program product according to claim 8, wherein, after the first difference becomes smaller than the first allowable change range, the second allowable change range is calculated from an average value and variation of the measurement results by using the measurement results after removing the first measurement result.

10. The computer program product according to claim 8, wherein the measurement results are classified with respect to each pattern feature amount, and wherein the second function is calculated based on the classified the measurement results with respect to each classified pattern feature amount.

11. The computer program product according to claim 8, wherein information on the pattern feature amount is a shape or dimension of the pattern.

12. The computer program product according to claim 10, wherein, when the measurement results are to be classified with respect to each pattern feature amount, the measurement results are classified based on information on the shape of the resist pattern.

13. The computer program product according to claim 8, wherein the line width is measured by using dimension data of the resist pattern formed on the first substrate or a top surface observation image of the resist pattern.

14. The computer program product according to claim 10, wherein the second function is a quantitative model according to an irregularity of the measurement results depending on the pattern feature amount, and the quantitative model is calculated with respect to each pattern feature amount based on the classified measurement results.

15. A method of manufacturing a semiconductor device comprising:

forming a resist pattern by transferring a mask pattern on a first substrate with an exposing amount and a focus value being changed;

measuring a line width of the resist pattern;

calculating a first function which is a polynomial equation including the exposing amount and the focus value as parameters and is fit for measurement results of the line width and calculating a difference value between the measurement results and the approximated value on the first function as a first difference;

comparing, by a computer the first difference with a first allowable change range calculated from an irregularity of the exposing amount and an irregularity of the focus value as an allowable change range of the line width and, in the case where a first measurement result of which the first difference becomes larger than the first allowable change range exists in the measurement results, removing the first measurement result and regenerating a first function which is fit for the measurement results after removing the first measurement result;

repeating a process of removing the first measurement result and regenerating the first function until the first difference becomes smaller than the first allowable change range;

calculating a second function which is a polynomial equation including information on a pattern feature amount which is a feature amount of the pattern as a parameter and is fit for the measurement results of the line width with respect to each pattern feature amount and calculating a difference value between the measurement results and the approximated value on the second function as a second difference with respect to each pattern feature amount;

comparing the second difference with a second allowable change range calculated with respect to each pattern feature amount as an allowable change range of the line width with respect to each pattern feature amount and, in the case where a second measurement result of which the second difference becomes larger than the second allowable change range exists in the measurement results, removing the measurement result and regenerating a second function which is fit for the measurement results after removing the second measurement result;

repeating a process of removing the second measurement result and regenerating the second function until the second difference becomes smaller than the second allowable change range;

calculating an estimated line width of a pattern performed on a second substrate by performing lithography simulation on the mask by using a first simulation model created based on the measurement results after removing the first measurement result;

calculating a difference value between the estimated line width and the measurement results after removing the first measurement result as a third difference;

comparing the third difference with a third allowable change range calculated from an average value and variation of the mask pattern line width as an allowable change range of the estimated line width and, in the case where a third measurement result of which the third difference becomes larger than the third allowable change range exists, removing the measurement result and creating a second simulation model based on the measurement results after removing the third measurement result; and adjusting a mask pattern dimension of a product mask by using the second simulation model and forming a substrate pattern on a product substrate by using the product mask of which the mask pattern dimension is adjusted.

16. The method of manufacturing a semiconductor device according to claim 15, wherein, after the first difference becomes smaller than the first allowable change range, the second allowable change range is calculated from an average value and variation of the measurement results by using the measurement results after removing the first measurement result.

17. The method of manufacturing a semiconductor device according to claim 15,
wherein the measurement results are classified with respect to each pattern feature amount, and
wherein the second function is calculated based on the classified measurement results with respect to each pattern feature amount.

18. The method of manufacturing a semiconductor device according to claim 15, wherein information on the pattern feature amount is a shape or dimension of the pattern.

19. The method of manufacturing a semiconductor device according to claim 17, wherein, when the measurement results are to be classified with respect to each pattern feature amount, the measurement results are classified based on information on the shape of the resist pattern.

20. The method of manufacturing a semiconductor device according to claim 15, wherein the line width is measured by using dimension data of the resist pattern formed on the first substrate or a top surface observation image of the resist pattern.

* * * * *